(12) United States Patent
Ashley et al.

(10) Patent No.: US 7,516,394 B2
(45) Date of Patent: Apr. 7, 2009

(54) METHOD AND APPARATUS FOR COMBINED ENCODER/SYNDROME COMPUTER WITH PROGRAMMABLE PARITY LEVEL

(75) Inventors: Jonathan James Ashley, Los Gatos, CA (US); Clifton Williamson, Saratoga, CA (US)

(73) Assignee: Agere Systems Inc., Allentown, PA (US)

( * ) Notice: Subject to any disclaimer, the term of this patent is extended or adjusted under 35 U.S.C. 154(b) by 475 days.

(21) Appl. No.: 11/079,634

(22) Filed: Mar. 14, 2005

(65) Prior Publication Data

US 2006/0212783 A1    Sep. 21, 2006

(51) Int. Cl.
*H03M 13/00* (2006.01)
(52) U.S. Cl. ...................................... 714/784
(58) Field of Classification Search .............. 714/784, 714/746, 755, 781–782
See application file for complete search history.

(56) References Cited

U.S. PATENT DOCUMENTS

| | | | | |
|---|---|---|---|---|
| 4,562,577 | A | * 12/1985 | Glover et al. | 714/769 |
| 4,777,635 | A | * 10/1988 | Glover | 714/756 |
| 5,444,719 | A | 8/1995 | Cox et al. | 714/769 |
| 5,778,009 | A | * 7/1998 | Fredrickson et al. | 714/752 |
| 6,327,690 | B1 | * 12/2001 | Zhang et al. | 714/769 |
| 6,405,339 | B1 | * 6/2002 | Cox et al. | 714/756 |
| 6,640,319 | B1 | * 10/2003 | Weng | 714/707 |
| 6,826,723 | B2 | 11/2004 | Fredridckson | 714/784 |
| 7,082,564 | B2 | * 7/2006 | Fredrickson et al. | 714/784 |

OTHER PUBLICATIONS

Fettweis et al., A combined Reed SOlomon encoder and symdrome generator with small hardware complexity, 1992, IEEE, p. 1871-1874.*

* cited by examiner

*Primary Examiner*—Shelly A Chase
(74) *Attorney, Agent, or Firm*—Ryan, Mason & Lewis, LLP

(57) ABSTRACT

Methods and apparatus are provided for a combined encoder/syndrome computer with a programmable parity level. In one embodiment, a circuit is disclosed that generates check symbols during an encoding operation and generates error syndromes during a decoding operation. The circuit comprises a plurality of subfilters grouped into a multiple degree polynomial filter, where the number of multiple degree subfilters is less than a maximum number of symbols of redundancy.

20 Claims, 8 Drawing Sheets

METHOD AND APPARATUS FOR COMBINED ENCODER/SYNDROME COMPUTER WITH PROGRAMMABLE PARITY LEVEL

FIELD OF THE INVENTION

The present invention relates generally to error correction codes, such as Reed-Solomon error correction codes, polynomial codes and BCH codes.

BACKGROUND OF THE INVENTION

Error correcting codes, such as Reed-Solomon codes, have a wide range of applications in digital communications and storage. Reed-Solomon codes, for example, are used to correct errors in many systems including storage devices, wireless communications, and high-speed modem communications. Generally, a Reed-Solomon encoder takes a block of digital data, comprising a sequence of digital information bits, and interprets the data as a sequence of information symbols. Each symbol comprises m bits of the digital information sequence. The block of input data comprises k such information symbols. The Reed-Solomon encoder produces r additional redundant symbols, which are concatenated with the k information symbols to form a codeword comprising n (equal to k plus r) symbols. The parameters of the Reed-Solomon code are indicated by referring to such a code as an RS(n,k) code with m bit symbols.

Errors occur during transmission or storage for a number of reasons, such as noise or interference, or scratches on a storage medium. A Reed-Solomon decoder processes each block and attempts to correct errors and recover the original data. The number and type of errors that can be corrected depends on the characteristics of the Reed-Solomon code. In general, an RS(n,k) decoder can correct any combination of up to r/2 corrupted symbols provided that the remainder of the n symbols of the codeword are correct.

U.S. Pat. No. 5,444,719 to Cox et al., entitled "Adjustable Error-Correction Composite Reed-Solomon Encoder/Syndrome Generator" (hereinafter "Cox") and incorporated by reference herein, discloses a conventional combined Reed-Solomon encoder/syndrome generator. Cox discloses a Reed-Solomon encoder that cascades r filters with transfer functions of the form $$H_i(D) = \frac{1}{1 + \alpha^i D},$$

where i equals $0, 1, \ldots, r-1$. Each of the filters $H_i(D)$ can also be used independently to produce the decoder syndrome $S_i$ used in a complementary Reed-Solomon decoder. Cox uses the r filters $H_i(D)$ in cascade to perform the Reed-Solomon encoding function, and to perform syndrome computation, the first step of Reed-Solomon decoding. This reduces the amount of hardware required in an implementation utilizing a Reed-Solomon encoder and decoder in the same integrated circuit chip.

Cox's Reed-Solomon encoder implements polynomial filters of degree one. In particular, Cox teaches the use of r subfilters, each of degree one, which are cascaded to produce an encoder transfer function. Cox teaches that these r subfilters can also be used as syndrome calculators. Cox's individual stages of the cascaded filter can be easily disabled, providing for the ability to produce varying amounts of redundancy from the same basic circuit.

The critical path of the Cox Reed-Solomon encoders, however, can be quite long for large values of r. In addition, the Cox Reed-Solomon encoder fails to reduce the number of Galois field multipliers beyond that which is achieved in the case where the generator polynomial is symmetrical. While a conventional encoder that computes r parity symbols has r constant multipliers, if a generator polynomial is symmetrical, the encoder needs only r/2 multipliers. Nonetheless, the Cox Reed-Solomon encoders, still use r multipliers, even when the generator polynomial is symmetrical.

U.S. Pat. No. 6,826,723 to Fredrickson, entitled "Multi-Rate Reed-Solomon Encoders," (hereinafter "Fredrickson"), assigned to the assignee of the present invention and incorporated by reference herein, discloses a Reed-Solomon encoder that is capable of performing any of a plurality of encoding rates. The disclosed multi-rate Reed-Solomon encoder is comprised of a number of subfilters that is less than the maximum number of symbols of redundancy provided by the Reed-Solomon coding device. Among other benefits, the Fredrickson encoders provide a mechanism for reducing the number of constant multipliers to r/2, provided that the generator polynomial is symmetrical and that the degree of each subfilter is two. (The degree of a subfilter is the degree of its corresponding generator polynomial. A multiple degree subfilter corresponds to a polynomial of degree greater than one.)

While the multi-rate Reed-Solomon encoders disclosed by Fredrickson exhibit a reduced critical path and a reduced number of Galois field multipliers relative to the Cox encoders, the Fredrickson encoders do not generate the syndrome information required for many applications.

A need therefore exists for a composite multi-rate Reed-Solomon encoder/syndrome computer that, like the Fredrikson encoder, comprises a number of subfilters that is less than the number of symbols of redundancy, and therefore enjoys the same consequent benefits, but also, like the Cox encoder/syndrome computer, uses shared hardware for both encoding and syndrome computation.

SUMMARY OF THE INVENTION

Generally, methods and apparatus are provided for a combined encoder/syndrome computer with a programmable parity level. In one embodiment, a circuit is disclosed that generates check symbols during an encoding operation and generates error syndromes during a decoding operation. The circuit comprises a plurality of subfilters grouped into a multiple degree polynomial filter, where the number of subfilters is less than a maximum number of symbols of redundancy.

According to another aspect of the invention, an error correction method is disclosed that generates check symbols during an encoding operation; and generates error syndromes during a decoding operation, wherein both generating steps employ a circuit comprising a plurality of subfilters grouped into a multiple degree polynomial filter, where the number of subfilters is less than a maximum number of symbols of redundancy.

A more complete understanding of the present invention, as well as further features and advantages of the present invention, will be obtained by reference to the following detailed description and drawings.

DETAILED DESCRIPTION

The present invention provides encoders and syndrome computers for polynomial codes over a Galois field $GF(2^m)$. Galois fields provide a way of defining the arithmetic operations of addition, subtraction, multiplication, and division on arrays of m bits. This mathematical structure enables an "algebraic approach" to error correction algorithms. For example, the ability to view blocks of data as polynomials is central to the disclosed methodology. A discussion of the fundamental properties of Galois fields can be found, for example, E. Berlekamp, Algebraic Coding Theory (Revised 1984 Ed., Aegean Park Press).

The present invention provides encoders with a programmable parity level, and realizes a gate count reduction by combining an encoder and a syndrome computer into a single hardware block. As used herein, "parity level" refers to the number of parity (or check) symbols appended to the user data in the encoding process. The more check symbols, the greater the level of data protection. A programmable parity level allows the user to select the desired level of protection. Syndrome computation is the first step in the decoding and error correction process.

Systematic Encoders

Let $$g(x) = x^r + g_{r-1}x^{r-1} + \ldots + g_1 x + g_0$$

be the generator polynomial for a polynomial code C over $GF(2^m)$, where the coefficients $g_j$ are elements of $GF(2^m)$. Thus, $c(x) \in GF(2^m)[x]$ is a codeword in C if and only if $c(x)$ is divisible by $g(x)$. Systematic encoding requires that, when a data polynomial $d(x)$ is encoded as a codeword $c(x)$, the coefficients of $d(x)$ should appear as coefficients of $c(x)$. Dividing $x^r d(x)$ by $g(x)$, the following is obtained:

$$x^r \cdot d(x) = q(x) \cdot g(x) + p(x)$$

where $\deg(p) < \deg(g)$. Thus, $c(x) = x^r \cdot d(x) + p(x) = q(x)g(x)$ is a multiple of $g(x)$ and is, hence, a codeword. (In $GF(2^m)$ addition and subtraction are the same operation: they are both bit-wise XOR. Therefore, when $p(x)$ was subtracted from both sides of the above equation, it can be viewed as having been added to, rather than subtracted from, the left hand side, yielding the above formula for $c(x)$.) Note that, since $\deg(p) \leq r-1$, the sum $x^r \cdot d(x) + p(x)$ is essentially a concatenation of the coefficients of $d(x)$ with the coefficients of $p(x)$. Therefore, the data symbols in $d(x)$ are the coefficients of the terms in $c(x)$ of degree r and higher and the parity symbols in $p(x)$ are the coefficients of the terms of degree less than r.

Figure 1:
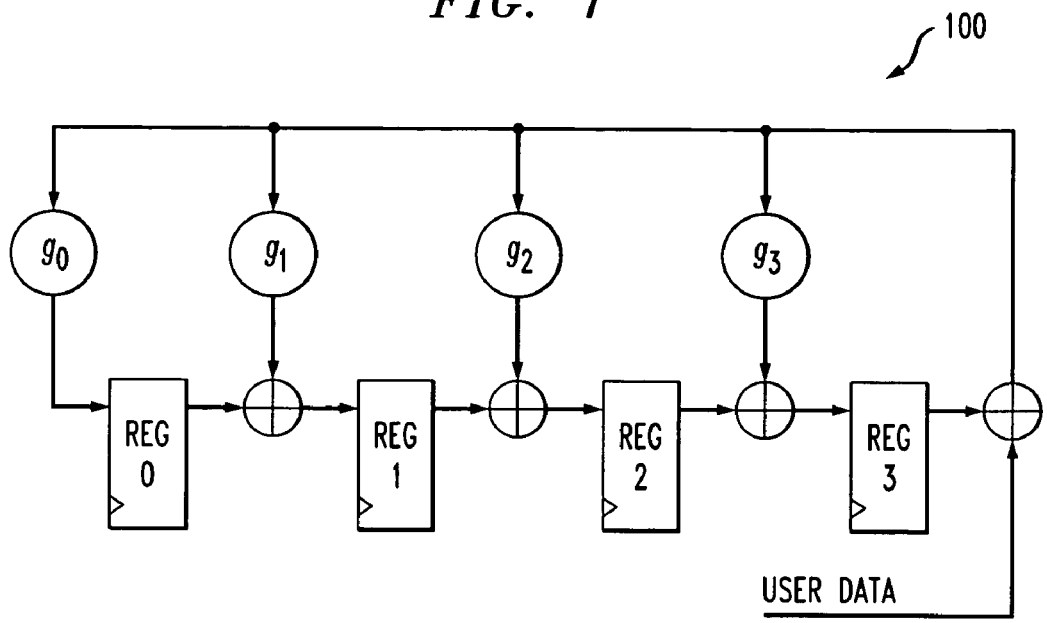
FIG. 1 illustrates a systematic encoder for a generator polynomial of degree 4.

To avoid block diagrams containing an abundance of ellipses, the present discussion is limited to the case r=4. The principles discussed here carry over directly to the case of general r. FIG. 1 illustrates a prototype of an encoder 100 using the generating polynomial $$g(x) = x^4 + g_3 x^3 + g_2 x^2 + g_1 x + g_0$$

As shown in FIG. 1, the exemplary encoder 100 comprises four constant multipliers $g_i$, representing, i.e., logic that multiplies arbitrary Galois field elements by the fixed coefficients of $g(x)$; four banks of flip-flops Reg 0, Reg 1, Reg 2, and Reg 3; and four adders $\oplus$ representing banks of XOR gates. All buses in the diagram are m bits wide. Let $a_0, a_1, a_2, a_3$ be the values stored in the registers Reg 0, Reg 1, Reg 2, and Reg 3, respectively. These values represent the coefficients of a polynomial $a(x) = a_0 + a_1 x + a_2 x^2 + a_3 x^3$. When the input to the circuit on the line labeled "User data" is d, after one clock cycle the coefficients of $a(x)$ are replaced by the coefficients of $x \cdot a(x) + d \cdot x^4 \pmod{g(x)}$. To encode a data polynomial $d(x) = d_0 x^{k-1} + d_1 x^{k-2} + \ldots + d_{k-2} x + d_{k-1}$, the following steps are taken:

the flip-flops are first cleared;

in the first iteration, the input to the circuit is $d_0$ and one clock cycle later, the flip-flops contain the coefficients of $d_0 x^4 \pmod{g(x)}$;

in the second iteration, the input to the circuit is $d_1$ and one clock cycle later, the flip-flops contain the coefficients of $d_0 x^5 + d_1 x^4 \pmod{g(x)}$; and after k iterations, the flip-flops contain the coefficients of $d_0 x^{k+3} + d_1 x^{k+2} + \ldots + d_{k-2} x^5 + d_{k-1} x^4 \pmod{g(x)}$.

After k iterations, the coefficients in the registers are exactly the coefficients of the remainder polynomial $p(x)$ described above.

Figure 2:
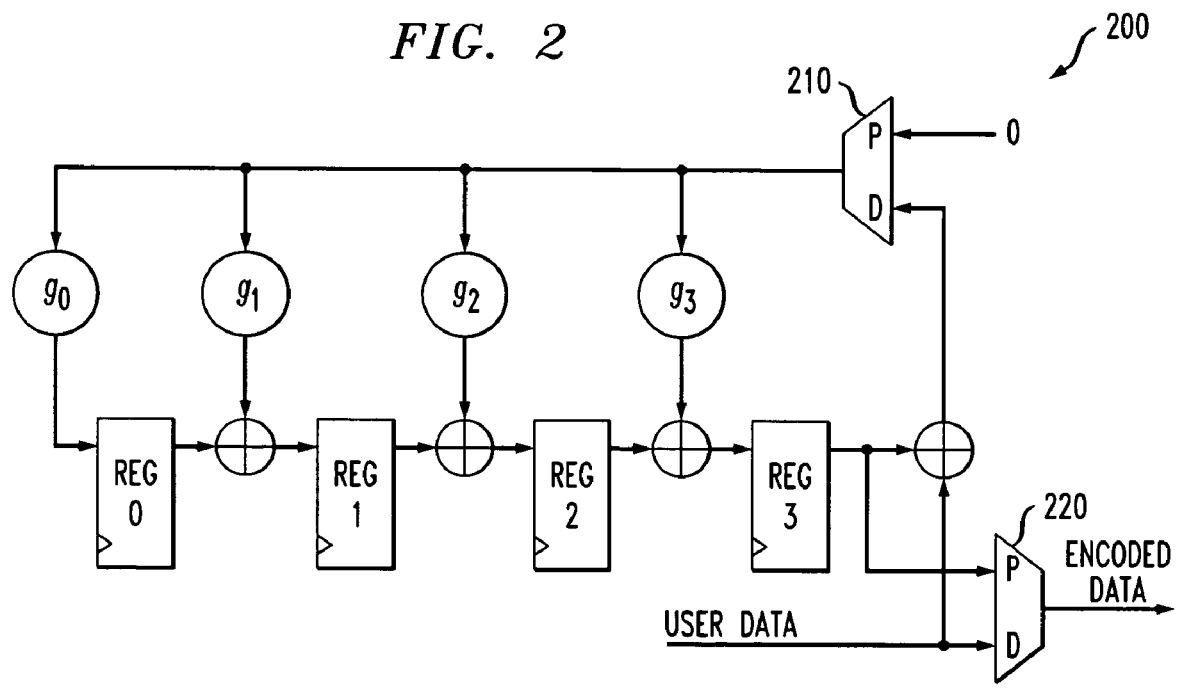
FIG. 2 illustrates a modification to the systematic encoder of FIG. 1 to enable the transfer of data and parity symbols out of the encoder circuit.

FIG. 2 illustrates a slight modification of the circuit 100 of FIG. 1, which enables the transfer of the data and parity symbols out of the encoder circuit 200. The transfer of k user data symbols occurs during the first k clock cycles, during which time the inputs labeled 'D' are selected as the outputs of the two multiplexers 210, 220. The upper multiplexer 210 sends the output of the XOR bank to the constant multipliers, $g_i$, as in FIG. 1, and the lower multiplexer 220 transfers the data symbols on the output port as "Encoded data". The transfer of parity symbols occurs during the next r clock cycles, during which time the inputs labeled P are selected as the outputs of the multiplexers 210, 220. The upper multiplexer 210 sends m zeroes to the constant multipliers, $g_i$, allowing the parity symbols to be shifted out one per clock cycle. The lower multiplexer 220 transfers the parity symbols as "Encoded data."

Figure 3:
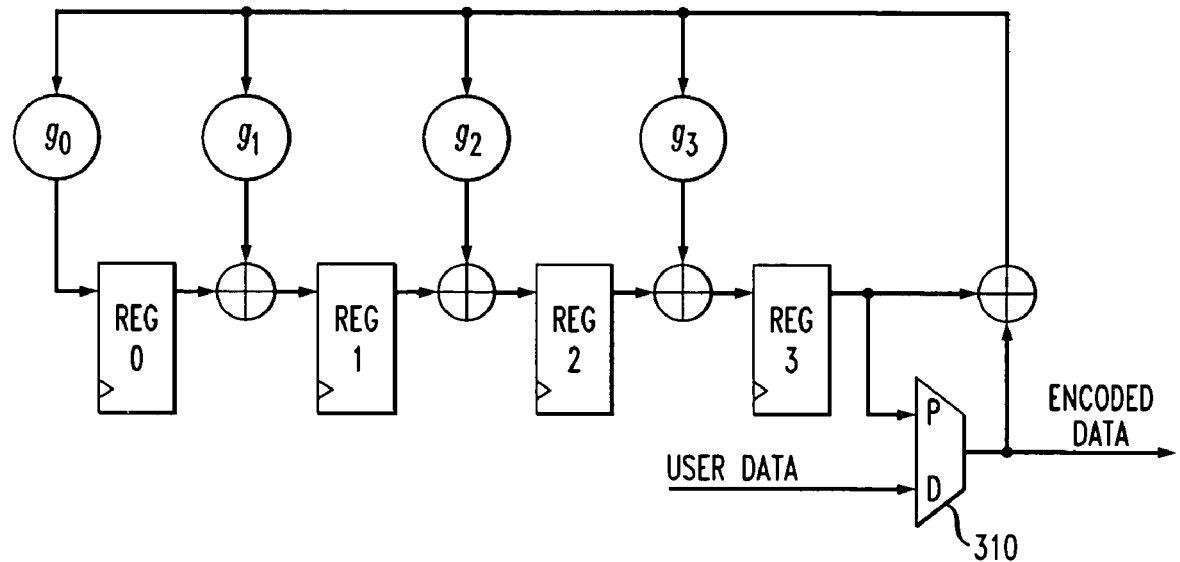
FIG. 3 illustrates a linear version of the systematic encoder of FIG. 2.

One drawback of the approach in FIG. 2 is the non-linearity introduced by the multiplexer 210 controlling the input to the constant multipliers. A programmable encoder according to the present invention involves linear systems theory, whereby an output Y(D) of a block can be expressed in terms of the input X(D) to the block by means of a transfer function: $Y(D) = F(D) \cdot X(D)$. (Here D denotes the usual delay operator) As it stands, the circuit 200 in FIG. 2 cannot be described in this fashion, so the encoder is modified to eliminate the non-linearity, as illustrated in FIG. 3. FIG. 3 illustrates a linear version 300 of the circuit 200 of FIG. 2. During the transfer of data symbols, the output of the multiplexer 310 consists of the user data symbols and the encoder functions as before. During the transfer of parity symbols, the output of the multiplexer 310 consists of the symbol in Reg 3, so that both inputs to the XOR bank are the same. Hence, the input to the constant multipliers $g_i$ again consists of m zeroes and, as before, the parity symbols are shifted out of the registers. Note that during the transfer of parity symbols, the parity symbol is both an output from and an input to the encoder. However, since the parity symbol is the output of a bank of flip-flops, there will not be any unstable feedback loops.

Figure 4:
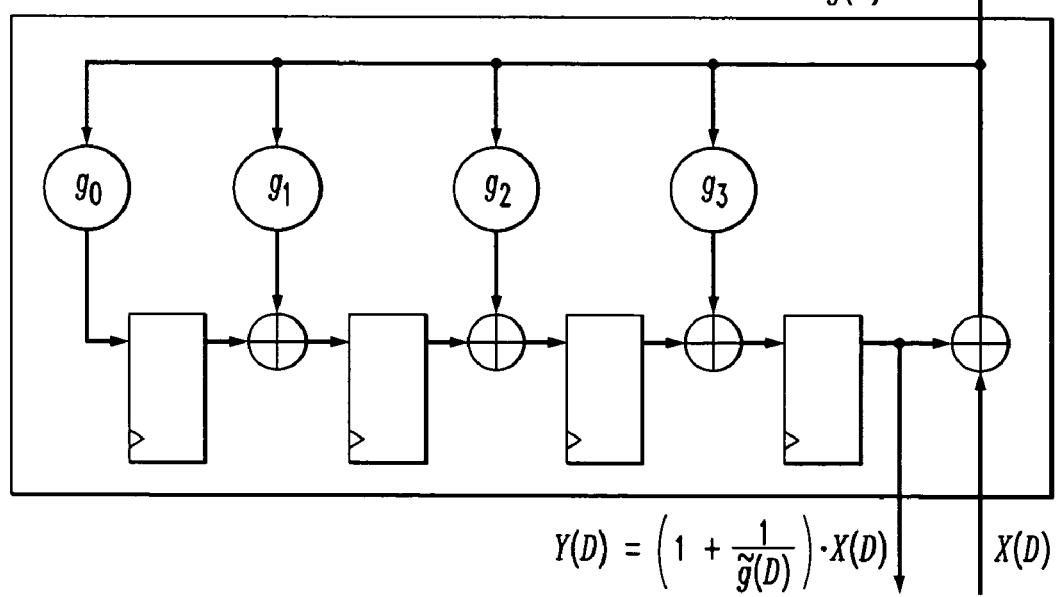
FIGS. 4 and 5 illustrate circuits that extend the encoder of FIG. 1.

The encoders in FIGS. 1 and 3 are essentially linear filters, so they can be described in terms of transfer functions. FIG. 4 illustrates a circuit 400 that takes the encoder 100 in FIG. 1, labels the input X(D), and adds two outputs Y(D) and H(D). Here, D denotes the usual delay operator. In addition to facilitating the computation of transfer functions, the output H(D) will also be used in the construction of encoders with programmable parity levels. Let $\tilde{g}(x)=x^4 g(1/x)=1+g_3 x+g_2 x^2+g_1 x^3+g_0 x^4$, i.e. $\tilde{g}(x)$ is $g(x)$ with the order of the coefficients reversed. The polynomial $g(x)$ is called "symmetrical" if $\tilde{g}(x)=g(x)$, that is, if $g(x)$ is still the the same polynomial when its coefficients are reversed. In FIG. 4, it can be seen that $$Y(D) = (g_3 D + g_2 D^2 + g_1 D^3 + g_0 D^4) \cdot H(D)$$
$$= (1 + \tilde{g}(D)) \cdot H(D)$$
$$H(D) = X(D) + Y(D)$$

The output Y(D) can be solved for in terms of the input X(D):

$$Y(D) = (1 + \tilde{g}(D)) \cdot H(D)$$
$$Y(D) = (1 + \tilde{g}(D)) \cdot (X(D) + Y(D))$$
$$\tilde{g}(D) \cdot Y(D) = (1 + \tilde{g}(D)) \cdot X(D)$$
$$Y(D) = \frac{1 + \tilde{g}(D)}{\tilde{g}(D)} \cdot X(D)$$
$$= \left(1 + \frac{1}{\tilde{g}(D)}\right) \cdot X(D)$$
$$H(D) = \frac{1}{\tilde{g}(D)} \cdot X(D)$$

FIG. 4 provides an abstract model of a fundamental building block B for systematic encoders. The systematic encoders should satisfy the following minimal requirements:

there is an m-bit wide input X(D),
there is an m-bit wide output $$Y(D) = \left(1 + \frac{1}{\tilde{g}(D)}\right) \cdot X(D).$$

there is an m-bit wide output $$H(D) = \frac{1}{\tilde{g}(D)} \cdot X(D),$$

and all paths from the input X(D) to the output Y(D) pass through at least one flip-flop. The encoder in FIG. 4 will have only two distinct constant multipliers in the case where the polynomial g(x) is symmetrical, since $g_0=1$ and $g_1=g_3$. In general, the number of constant multipliers will be halved for any symmetrical polynomial g(x) of even degree.

Figure 5:
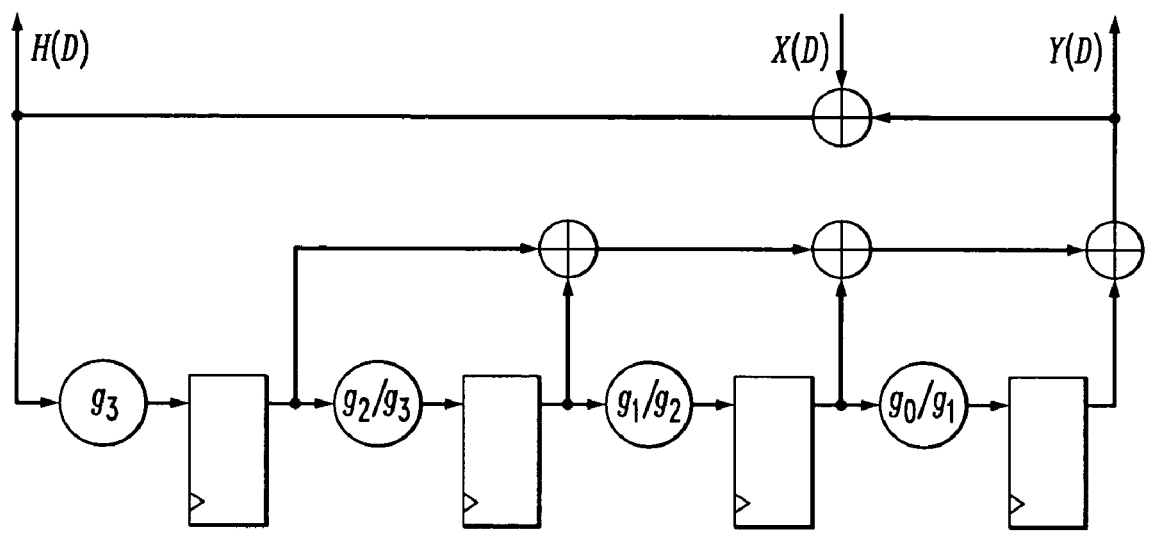

Conditions are only placed on the ports of the block and not on the internal implementation. The encoder 400 in FIG. 4 could be replaced by any circuit satisfying the above four criteria. Another such encoder 500 is shown in FIG. 5, as further described in U.S. Pat. No. 6,826,723 to Fredrickson, entitled "Multi-Rate Reed-Solomon Encoders," (hereinafter "Fredrickson"), assigned to the assignee of the present invention and incorporated by reference herein.

Programmable Parity Levels

As previously indicated, the present invention provides a systematic encoder for the code generated by g(x) out of smaller filters that are essentially encoders for codes generated by factors of g(x). This approach enables an encoder that allows multiple parity levels. As a first example, let $g(x)=g_0(x) \cdot g_1(x)$. An encoder for the code with generator polynomial g(x) can be constructed from encoders for the codes with generator polynomials $g_0(x)$ and $g_1(x)$. For each polynomial $g_i(x)$, there is a block with input $X_i(D)$ and with outputs:

$$Y_i(D) = \left(1 + \frac{1}{\tilde{g}_i(D)}\right) \cdot X_i(D) \text{ and}$$
$$H_i(D) = \frac{1}{\tilde{g}_i(D)} \cdot X_i(D).$$

Figure 6:
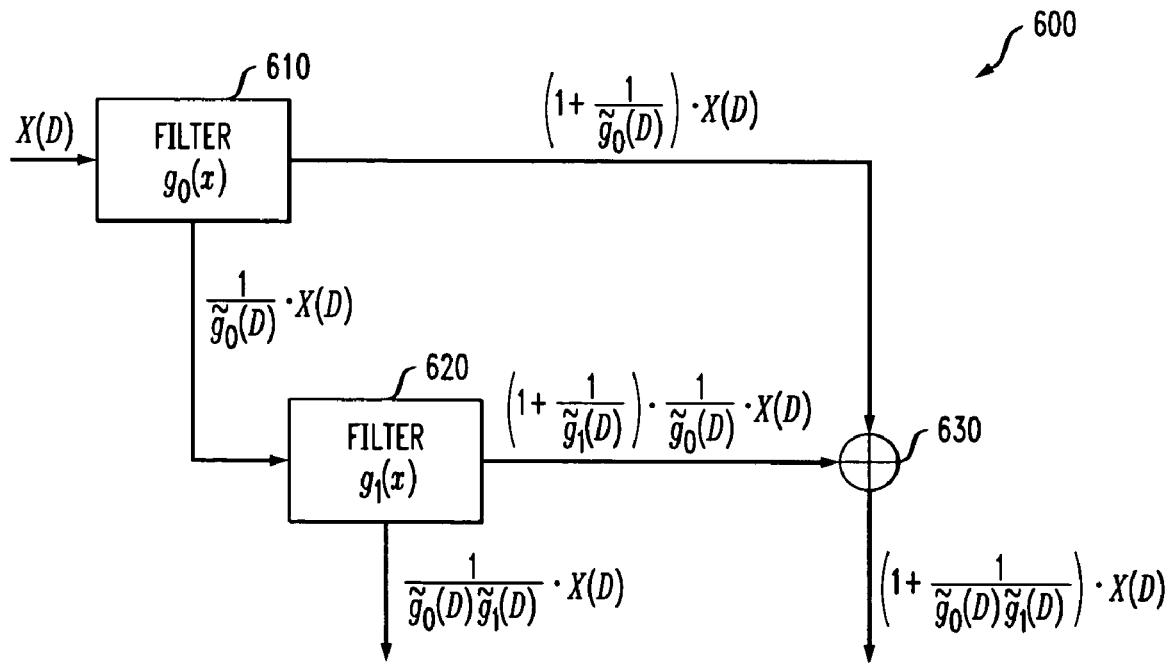
FIG. 6 illustrates a two-block systematic encoder incorporating features of the present invention.

FIG. 6 illustrates a circuit 600 where the output $H_0(D)$ of the first filter 610 is also the input $X_1(D)$ of the second filter 620. If $Y(D)=Y_0(D)+Y_1(D)$ and H(D) is the output $H_1(D)$, then $$Y(D) = \left(1 + \frac{1}{\tilde{g}(D)}\right) \cdot X(D) \text{ and}$$
$$H(D) = \frac{1}{\tilde{g}(D)} \cdot X(D)$$

Thus, the circuit 600 in FIG. 6 can be used as a filter for the polynomial g(x).

Figure 7:
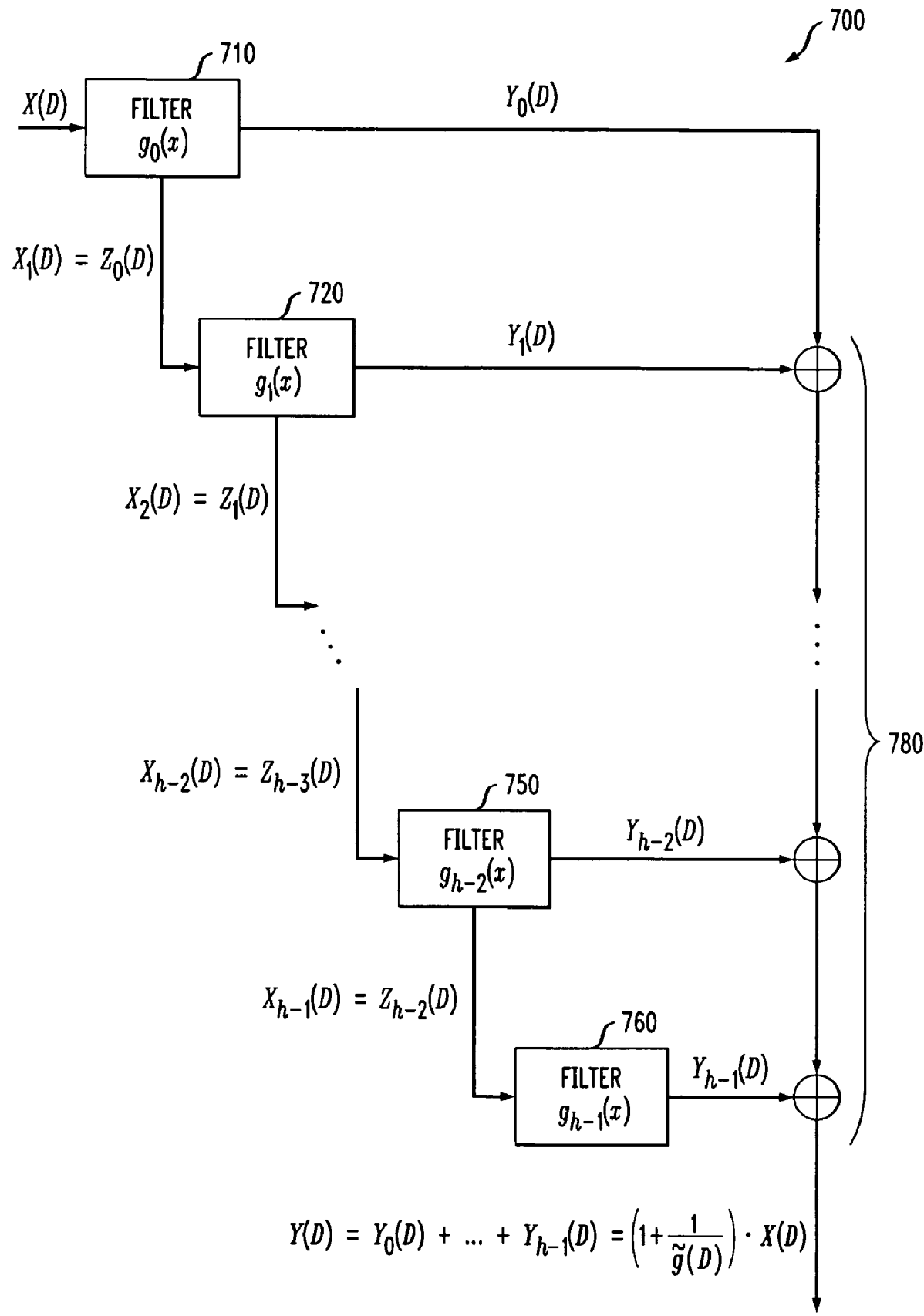
FIG. 7 illustrates a multi-block systematic encoder incorporating features of the present invention.

This idea carries over directly to a filter 700 built out of h subfilters, as illustrated in FIG. 7. FIG. 7 thus illustrates a multi-block systematic encoder 700. As shown in FIG. 7, the factorization of the generator polynomial is $$g(x)=g_0(x) \cdot g_1(x) \ldots g_{h-2}(x) \cdot g_{h-1}(x)$$

The output $H_i(D)$ of the $i^{th}$ filter, such as filter 710, is the input $X_{i+1}(D)$ to the $(i+1)^{st}$ filter, such as filter 720. In the case where g(x) is symmetrical and of even degree and $n_0$, $n_1, \ldots, n_{h-1}$ are even intgers whose sum is deg(g), then the polynomials $g_i(x)$ can always be chosen to be symmetrical with $\deg(g_i)=n_i$.

Figure 8:
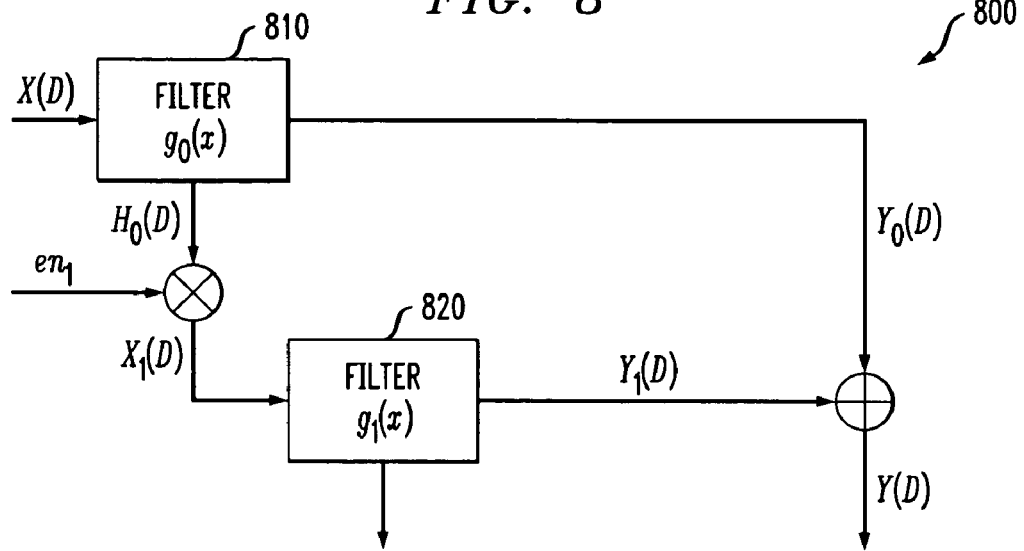
FIG. 8 illustrates an exemplary programmable two-block systematic encoder that provides a programmable parity level.

FIG. 8 illustrates an exemplary programmable two-block systematic encoder 800 that allows subfilters 820 to be selectively disabled, allowing a programmable parity level. The input $X_1(D)$ to the second subfilter 820 is controlled by an "enable bit" $en_1$. When this bit is 1, the input $X_1(D)$ is the output $H_0(D)$ of the first subfilter 810 and, as before, the output Y(D) output of the encoder 800 is:

$$\left(1 + \frac{1}{\tilde{g}(D)}\right) \cdot X(D)$$

In this mode, the filter 800 acts as a filter for the generator polynomial $g(x)=g_0(x)g_1(x)$. When the bit is 0, the input $X_1(D)$ is all zeroes, all outputs of the second subfilter 820 are zero, and the output Y(D) of the filter 800 is:

$$\left(1 + \frac{1}{\tilde{g}_0(D)}\right) \cdot X(D)$$

In this mode, the filter 800 acts as a filter for the generator polynomial $g_0(x)$.

Similar modifications may be made to the circuit 700 in FIG. 7. The input to the $i^{th}$ filter can be controlled by an enable bit $en_i$ so that $X_i(D)$ is either the $H_{i-1}(D)$ output of the (i−1)st filter or all zeroes. When the input to the $i^{th}$ filter is zero, the $i^{th}$ filter has been disabled. When filters i+1 through h−1 have been disabled, the transfer function for the output of the filter 700 is:

$$1 + \frac{1}{\tilde{g}_0(D) \ldots \tilde{g}_i(D)}.$$

and the block functions as a filter for the code with generator polynomial $g_0(x)g_1(x) \ldots g_i(x)$. Here, the number of parity symbols is $\deg(g_0)+\deg(g_1)+ \ldots +\deg(g_i)$. It will always be the case that the first i+1 filters will be enabled and the remaining filters will be disabled for some value of i.

The exemplary embodiments focus on the case where deg $(g_i)=4$ for all i. The case where $\deg(g_i)=1$ for all i is essentially the Cox invention and was considered by G. Fettweis and M. Hassner, "A Combined Reed-Solomon Encoder and Syndrome Generator with Small Hardware Complexity," IEEE Int'l Symposium on Circuits and Systems, ISCAS '92, Vol. 4, 1871-1874 (1992), specifically for Reed-Solomon codes, as well as by related U.S. Pat. No. 5,444,719 to Cox et al., entitled "Adjustable Error-Correction Composite Reed-Solomon Encoder/Syndrome Generator," referenced above. The Cox encoder is equivalent to the filter 700 in FIG. 7 with h=r subfilters, where r=deg(g). For a degree 1 polynomial, the only polynomial coefficient is $\alpha$, the root of the polynomial. This makes it particularly simple to produce a combined encoder/syndrome computer, as will be seen in the next section.

The Cox encoder comprises a chain of r−1 adders, which may lead to timing problems for large values of r. In the filter 700 in FIG. 7, there is a similar chain of adders 780 where the $Y_i(D)$ values are XORed together. In addition, since the output $H_i(D)$ is simply $X_i(D)$ XOR $Y_i(D)$, there is a second such chain in the path from X(D) to $H_{h-2}(D)$. In the above article, Fettweis and Hassner propose dealing with the long chain by pipelining the adders. Another possibility is to restrict the number of parity levels supported by the filter following Fredrickson. When the $g_i(x)$ are linear polynomials, every parity level from 1 to r is supported, which may be a finer granularity than is required. For example, if deg(g)=40, only parity levels of 24, 28, 32, 36, and 40 may need to be supported. This can be accomplished by taking h=5 and working with polynomials of degree:

$$\deg(g_0)=24, \deg(g_1)= \ldots =\deg(g_4)=4$$

It is noted that the number, h, of subencoders is less than the number, r, of symbols of redundancy if, and only if, at least one of the polynomials $g_0, g_1, \ldots, g_{h-1}$ has degree greater than 1.

Combined Encoders/Syndrome Computers

The case where all roots of g(x) lie in $GF(2^m)$ is now considered, which includes the case of Reed-Solomon codes. When the generator polynomial g(x) factors completely over $GF(2^m)$, the condition that a codeword c(x) is divisible by g(x) can be stated in terms of the roots of c(x). If $$g(x)=(x-\alpha_0) \cdot (x-\alpha_1) \ldots (x-\alpha_{r-1})$$

then g(x) divides c(x) if and only if $c(\alpha_i)=0$ for $i=0, 1, \ldots, r-1$. When a codeword c(x) is read from the storage medium, errors may have occurred. The data read from the medium can be expressed as v(x)=c(x)+e(x), where the polynomial e(x) represents the error pattern. Typically, the error correction process begins with the computation of the syndromes $S_i=v(\alpha_i)=e(\alpha_i)$ for $i=0, 1, \ldots r-1$ using Horner's algorithm. See D. Knuth, "The Art of Computer Programming," Addison-Wesley (2d ed., 1981) for a discussion of Horner's Rule.

Figure 9:
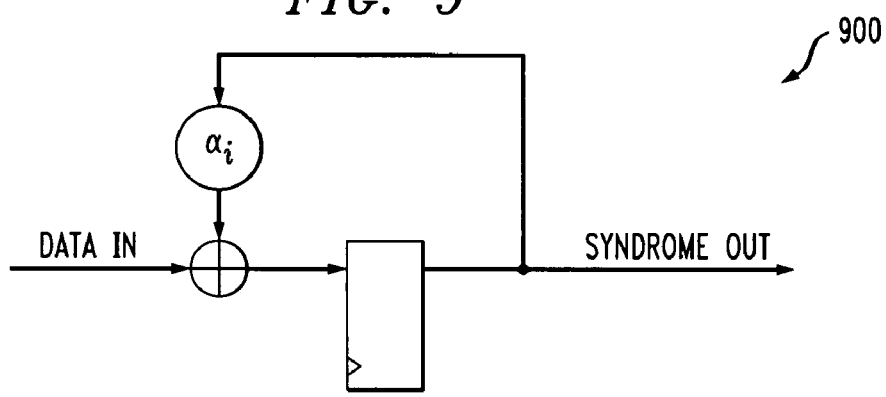
FIG. 9 illustrates a syndrome computer.

FIG. 9 illustrates a circuit 900 that computes $v(\alpha_i)$. If $$v(x)=v_{k+r-1}x^{k+r-1}+v_{k+r-2}x^{k+r-2}+ \ldots +v_1x+v_0$$

is a (possibly corrupted) codeword consisting of k data and r parity symbols, the following steps are taken:
  the flip-flops are first cleared;
  in the first iteration, the input on the line "data in" is $v_{k+r-1}$ and one clock cycle later the flip-flops contain $0 \cdot \alpha_i + v_{k+r-1} = v_{k+r-1}$;
  in the second iteration, the input is $v_{k+r-2}$ and one cycle later the flip-flops contain $v_{k+r-1} \cdot \alpha_i + v_{k+r-2}$;
  in the third iteration, the input is $v_{k+r-3}$ and one cycle later the flip-flops contain $(v_{k+r-1} \cdot \alpha_i + v_{k+r-2}) \cdot \alpha_i + v_{k+r-3} = v_{k+r-1} \cdot \alpha_i^2 + v_{k+r-2}\alpha_i + v_{k+r-3}$; and
  after k+r iterations, the flip-flops contain $v_{k+r-1} \cdot \alpha_i^{k+r-1} + \ldots + v_1\alpha_i + v_0$. This is the polynomial value $v(\alpha_i)$.

Figure 10:
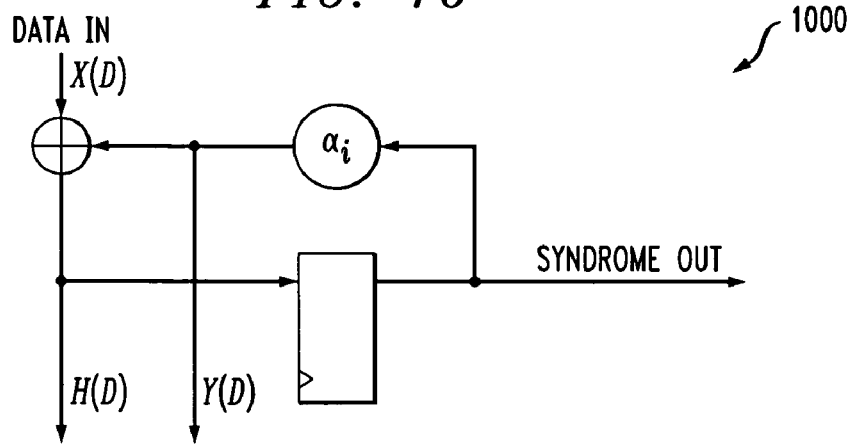
FIG. 10 illustrates a combined encoder/syndrome computer.

The circuit 900 in FIG. 9 comes close to being a filter for the degree 1 generator polynomial $g_i(x)=(x-\alpha_i)$. FIG. 10 shows a slight modification of this circuit 900, where $Y(D)=\alpha_i \cdot D \cdot H(D)=(1+\tilde{g}_i(D)) H(D)$ and H(D)=X(D)+Y(D). It follows that $$Y(D) = \left(1 + \frac{1}{\tilde{g}_i(D)}\right) \cdot X(D)$$

$$H(D) = \frac{1}{\tilde{g}_i(D)} \cdot X(D)$$

Therefore, the circuit 1000 functions as a subfilter for the factor $x-\alpha_i$.

Figure 11:
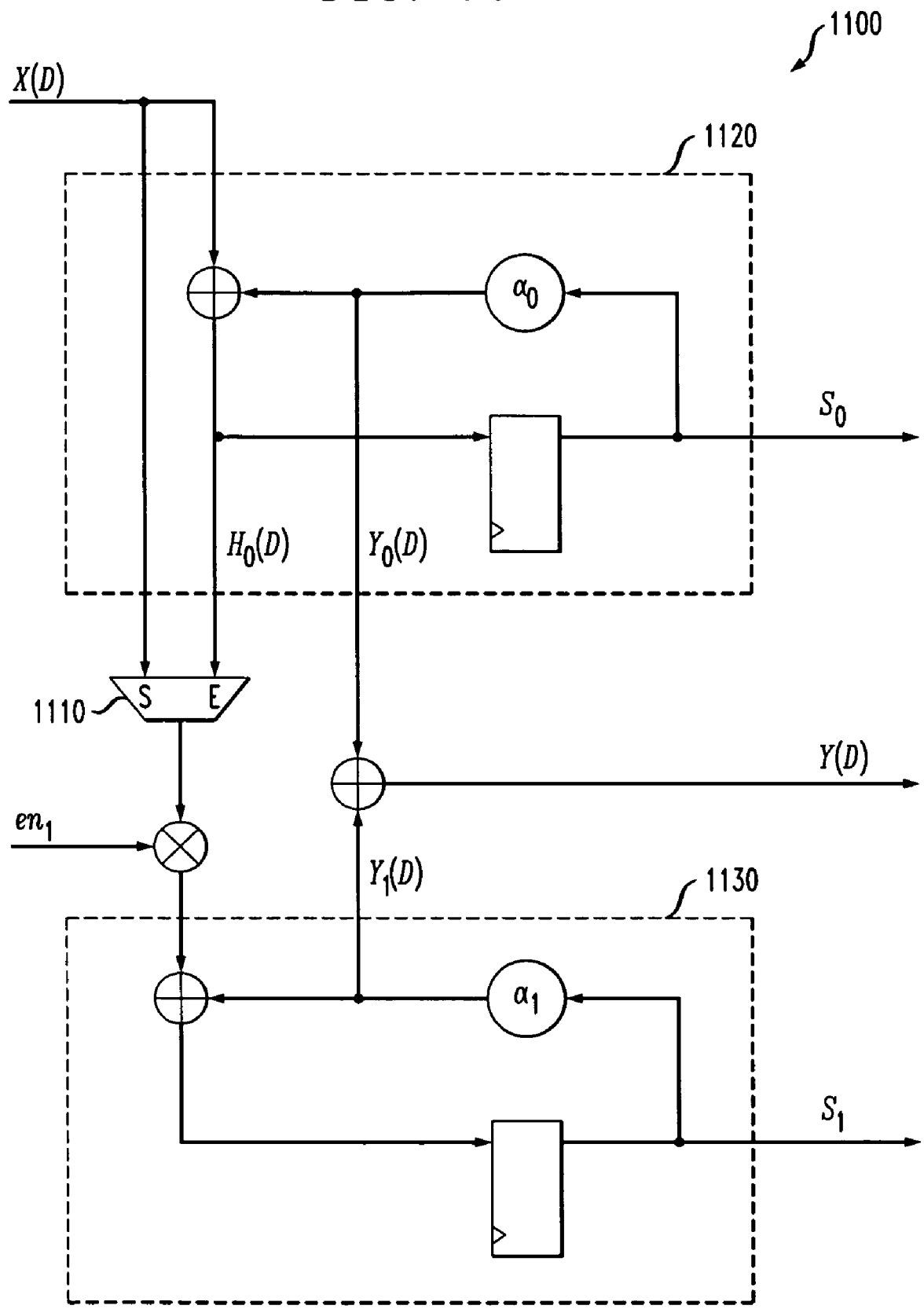
FIG. 11 illustrates a combined encoder/syndrome computer.

As with the Cox encoder, the circuit 1000 in FIG. 10 can be used as a building block for the programmable encoder/syndrome computer 1100 illustrated in FIG. 11. In an encoder mode, the output of the multiplexer 1110 is the input labeled E and the operation of the circuit 1100 is that of the programmable encoder 800 in FIG. 8. In a syndrome mode, the output of the multiplexer 1110 is the input labeled S and the input to both subblocks 1120, 1130 is X(D), so the circuit 1100 will compute the syndromes $S_0$ and $S_1$. The computation of $S_1$ can be disabled by setting $en_1$ to 0. The construction in FIG. 11 can be extended to generator polynomials of arbitrary degree, as would be apparent to a person of ordinary skill in the art, based on the disclosure herein. The inclusion of subblocks for additional degree 1 factors is handled in the way the subblock for the factor $x-\alpha_1$ was added to the subblock for the factor $x-\alpha_0$.

To handle the case of factors of the generator polynomial of arbitrary degree, the standard systematic encoder 400 in FIG. 4 is first modified. Again, consider the case r=4. Here, $$g(x) = x^4 + g_3 x^3 + g_2 x^2 + g_1 x + g_0$$
$$= (x-\alpha_0)\cdot(x-\alpha_1)\cdot(x-\alpha_2)\cdot(x-\alpha_3)$$

As a notational convenience, $\beta_i$ can be expressed as:

$$\beta_i = \prod_{j=0}^{i} \alpha_j$$

In other words, $\beta_0=\alpha_0$, $\beta_1=\alpha_0\cdot\alpha_1$ etc. It can be verified that the outputs Y(D) and H(D) of the circuit 1200 in FIG. 12 satisfy the following:

$$Y(D) = \left(1 + \frac{1}{\tilde{g}(D)}\right) \cdot X(D)$$

$$H(D) = \frac{1}{\tilde{g}(D)} \cdot X(D)$$

Figure 12:
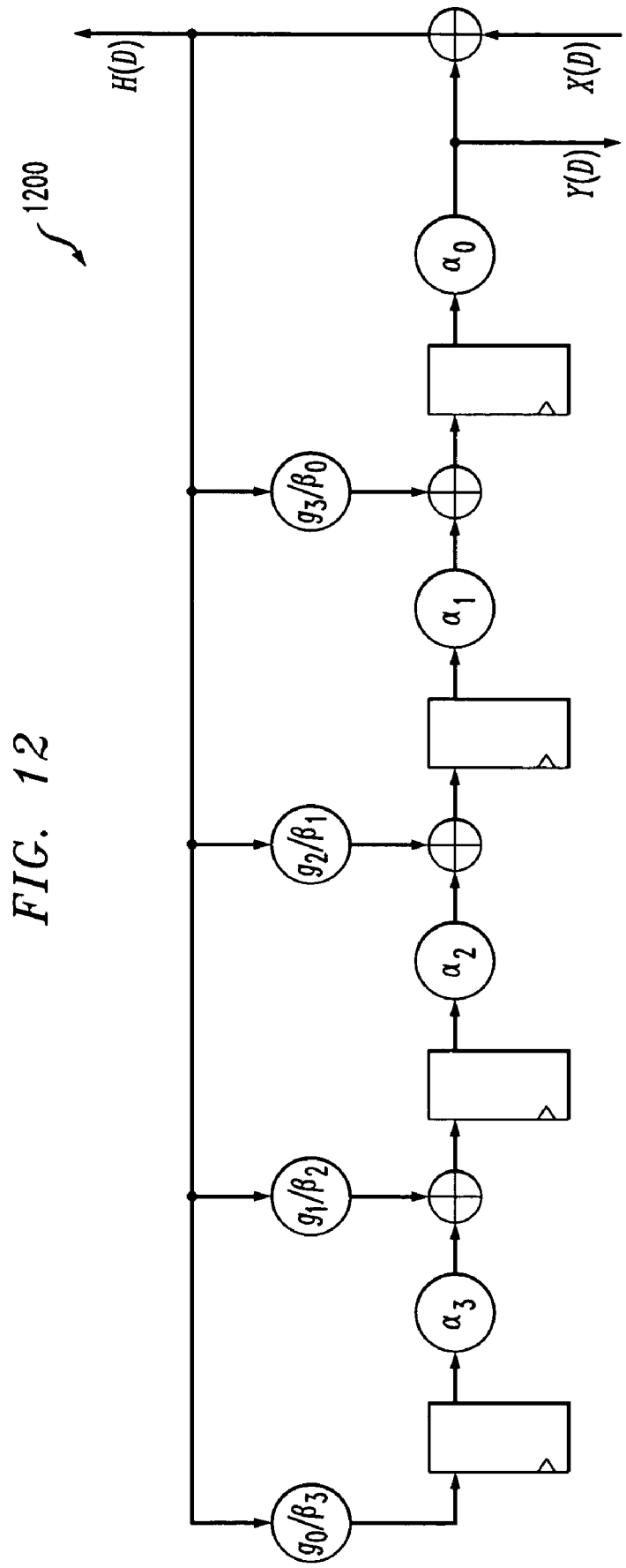
FIG. 12 illustrates a systematic encoder incorporating features of the present invention.

The circuit 1200 in FIG. 12 has constant multipliers for the roots $\alpha_i$ of the generator polynomial g(x), so that a simple modification of the circuit 1200 will allow the computation of syndromes. On the surface, it appears that this circuit 1200 now requires 8 constant multipliers instead of the 4 multipliers in the previous circuit. However, $g_0/\beta_3=1$ in general and in the case of Reed-Solomon codes, $g_1/\beta_2=g_3/\beta_0$: The roots $\alpha_i$ used for a Reed-Solomon code are consecutive powers of a primitive element $\alpha$, say $\alpha_i=\alpha^{m_0+i}$. Then $$\frac{g_1}{\beta_2} = \frac{\alpha_0\alpha_1\alpha_2 + \alpha_0\alpha_1\alpha_3 + \alpha_0\alpha_2\alpha_3 + \alpha_1\alpha_2\alpha_3}{\alpha_0\alpha_1\alpha_2}$$
$$= 1 + \frac{\alpha_3}{\alpha_2} + \frac{\alpha_3}{\alpha_1} + \frac{\alpha_3}{\alpha_0}$$
$$= 1 + \alpha + \alpha^2 + \alpha^3$$
$$= 1 + \frac{\alpha_1}{\alpha_0} + \frac{\alpha_2}{\alpha_0} + \frac{\alpha_3}{\alpha_0}$$
$$= \frac{\alpha_0 + \alpha_1 + \alpha_2 + \alpha_3}{\alpha_0}$$
$$= \frac{g_3}{\beta_0}$$

Thus, the circuit 1200 requires only two multipliers in addition to the multipliers for the roots of g(x). It can be shown in general that:

$$g(x) = (x-\alpha_0)\ldots(x-\alpha_{r-1})$$
$$= x^r + g_{r-1}\alpha^{r-1} + \ldots + g_1 x + g_0$$

If $\alpha_0,\ldots,\alpha_{r-1}$ satisfy $$\alpha_i \cdot \alpha_{r-1-i} = c$$

for some constant c and $\beta_i=\Pi_{j=0}^{i}\alpha_j$, then:

$$\frac{g_i}{\beta_{r-1-i}} = \frac{g_{r-i}}{\beta_{i-1}}$$

Therefore, when the degree r is even, r/2 additional multipliers are required for the modification in FIG. 12. When r is odd, (r-1)/2 additional multipliers are required.

Figure 13:
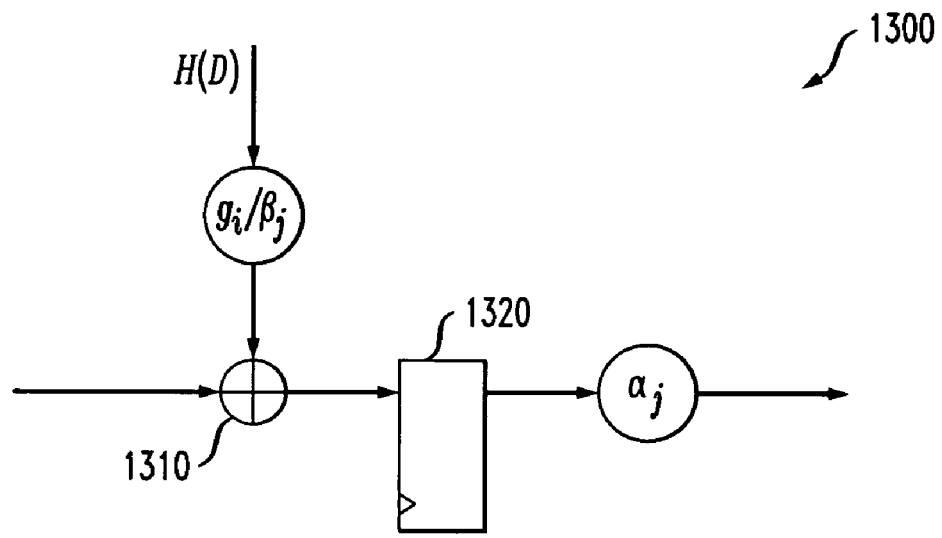
FIG. 13 is a schematic block diagram of encoder logic.
Figure 14:
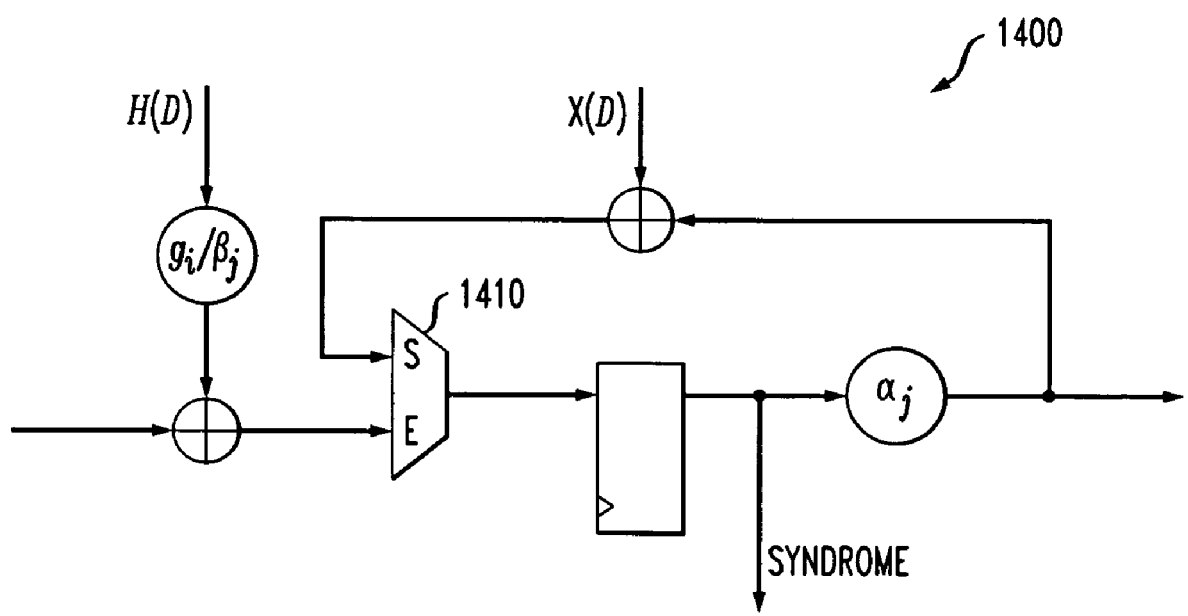
FIG. 14 is a schematic block diagram illustrating exemplary logic for a combined encoder/syndrome computer.

To describe the change needed to enable syndrome computation, focus on the portion of the encoder 1300 illustrated in FIG. 13, where the index j is r-1-i. In the case where i=0, there is no adder 1310 and the line from the constant multiplier for $g_i/\beta_j$ goes directly to the flip-flop 1320. The modified version of the logic appears in FIG. 14. In an encoder mode, the input labeled 'E' is the output of the multiplexer 1410 and the circuit 1400 functions like the circuit 1300 in FIG. 13. In a syndrome mode, the input labeled 'S' is the output of the multiplexer 1410 and the circuit 1400 functions like the circuit 900 in FIG. 9.

It is to be understood that the embodiments and variations shown and described herein are merely illustrative of the principles of this invention and that various modifications may be implemented by those skilled in the art without departing from the scope and spirit of the invention.

We claim:

1. An error correction system, comprising:
    a composite encoder/syndrome generating circuit for generating both check symbols during an encoding operation and error syndromes during a decoding operation, said circuit comprising a plurality of subfilters grouped into a multiple degree polynomial filter, said plurality being less than a maximum number of symbols of redundancy.

2. The error correction system of claim 1, further comprising programmable means for adjusting a number of said subfilters included in said circuit.

3. The error correction system of claim 1, further comprising means for adjusting a number of said subfilters included in said circuit.

4. The error correction system of claim 1, wherein said circuit is used to process Reed-Solomon error correction codes.

5. The error correction system of claim 1, wherein said circuit is used to process one or more of Reed-Solomon error correction codes, polynomial codes and BCH codes.

6. The error correction system of claim 1, further comprising a multiplexer to selectively enable generation of said check symbols and generation of said error syndromes.

7. The error correction system of claim 1, wherein a possible number of said multiple degree subfilters is an arbitrary even degree.

8. An error correction system, comprising:
    a circuit that generates check symbols during an encoding operation and generates error syndromes during a decoding operation, said circuit comprising a plurality of subfilters grouped into a multiple degree polynomial filter, said plurality being less than a maximum number of symbols of redundancy.

9. The error correction system of claim 8, further comprising programmable means for adjusting a number of said subfilters included in said circuit.

10. The error correction system of claim 8 further comprising means for adjusting a number of said subfilters included in said circuit.

11. The error correction system of claim 8, wherein said circuit is used to process Reed-Solomon error correction codes.

12. The error correction system of claim 8, wherein said circuit is used to process one or more of Reed-Solomon error correction codes, polynomial codes and BCH codes.

13. The error correction system of claim 8, further comprising a multiplexer to selectively enable generation of said check symbols and generation of said error syndromes.

14. The error correction system of claim 8, wherein a possible number of said subfilters is an arbitrary even degree.

15. An error correction method, comprising:
generating check symbols during an encoding operation; and
generating error syndromes during a decoding operation, wherein both generating steps employ a circuit comprising a plurality of subfilters grouped into a multiple degree polynomial filter, said plurality being less than a maximum number of symbols of redundancy.

16. The error correction method of claim 15, further comprising the step of adjusting a number of said subfilters included in said circuit.

17. The error correction method of claim 15, wherein said circuit is used to process Reed-Solomon error correction codes.

18. The error correction system of claim 15, wherein said circuit is used to process one or more of Reed-Solomon error correction codes, polynomial codes and BCH codes.

19. The error correction method of claim 15, further comprising a multiplexer to selectively enable generation of said check symbols and generation of said error syndromes.

20. The error correction system of method 15, wherein a possible number of said multiple degree subfilters is an arbitrary even degree.

* * * * *